(12) United States Patent
Aoki et al.

(10) Patent No.: US 7,760,503 B2
(45) Date of Patent: Jul. 20, 2010

(54) SEMICONDUCTOR MODULE AND INVERTER DEVICE

(75) Inventors: Kazuo Aoki, Anjo (JP); Junji Tsuruoka, Anjo (JP); Seiji Yasui, Nagoya (JP)

(73) Assignee: Aisin AW Co., Ltd., Anjo (JP)

( * ) Notice: Subject to any disclaimer, the term of this patent is extended or adjusted under 35 U.S.C. 154(b) by 76 days.

(21) Appl. No.: 12/078,167

(22) Filed: Mar. 27, 2008

(65) Prior Publication Data

US 2008/0291628 A1 Nov. 27, 2008

(30) Foreign Application Priority Data

May 22, 2007 (JP) ............................. 2007-135682

(51) Int. Cl.
*H05K 7/20* (2006.01)
(52) U.S. Cl. ............. 361/699; 361/679.46; 361/679.53; 361/715; 361/717; 165/80.4; 165/80.5; 165/104.33; 363/141
(58) Field of Classification Search ......... 361/605–642, 361/688–689, 699, 704–712, 718–724, 734, 361/763, 766, 775, 782, 793, 794, 818; 165/80.2, 165/80.3, 80.4, 80.5, 104.33, 104.34, 185; 257/706–727; 174/16.3, 35, 252; 363/56.02, 363/141, 144–147, 137; 307/9.1, 10.1, 11, 307/38, 115; 62/228.1, 259.2; 29/417, 602.1, 29/592.1, 740, 741, 759, 832, 831
See application file for complete search history.

(56) References Cited

U.S. PATENT DOCUMENTS

| | | | | | |
|---|---|---|---|---|---|
| 5,293,070 | A | * | 3/1994 | Burgess et al. | 257/714 |
| 5,412,558 | A | * | 5/1995 | Sakurai et al. | 363/98 |
| 5,494,149 | A | * | 2/1996 | Sillner | 198/471.1 |
| 5,966,291 | A | * | 10/1999 | Baumel et al. | 361/707 |
| 6,016,007 | A | * | 1/2000 | Sanger et al. | 257/714 |
| 6,166,937 | A | * | 12/2000 | Yamamura et al. | 363/141 |
| 6,414,867 | B2 | * | 7/2002 | Suzuki et al. | 363/141 |
| 6,594,149 | B2 | * | 7/2003 | Yamada et al. | 361/699 |
| 6,621,701 | B2 | * | 9/2003 | Tamba et al. | 361/699 |
| 6,882,850 | B2 | * | 4/2005 | McConnell et al. | 455/453 |
| 6,885,553 | B2 | * | 4/2005 | Pfeifer et al. | 361/688 |
| 6,888,729 | B2 | * | 5/2005 | Maekawa et al. | 363/56.02 |
| 6,906,404 | B2 | * | 6/2005 | Maly et al. | 257/678 |
| 6,956,742 | B2 | * | 10/2005 | Pfeifer et al. | 361/709 |
| 6,978,856 | B2 | * | 12/2005 | Nakamura et al. | 180/68.4 |
| 6,987,670 | B2 | * | 1/2006 | Ahmed et al. | 361/699 |

(Continued)

FOREIGN PATENT DOCUMENTS

JP    A 10-178151    6/1998

(Continued)

*Primary Examiner*—Michael V Datskovskiy
(74) *Attorney, Agent, or Firm*—Oliff & Berridge, PLC

(57) ABSTRACT

A semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate. The coolant flow paths are formed such that coolant flows in a coolant flow direction.

20 Claims, 10 Drawing Sheets

U.S. PATENT DOCUMENTS

| | | | |
|---|---|---|---|
| 7,012,810 B2 * | 3/2006 | Parkhill et al. | 361/775 |
| 7,042,725 B2 * | 5/2006 | Martin et al. | 361/699 |
| 7,068,507 B2 * | 6/2006 | Pfeifer et al. | 361/699 |
| 7,090,044 B2 * | 8/2006 | Nakamura et al. | 180/65.8 |
| 7,187,558 B2 * | 3/2007 | Parkhill et al. | 361/775 |
| 7,193,860 B2 * | 3/2007 | Parkhill et al. | 361/775 |
| 7,252,167 B2 * | 8/2007 | Nakamura et al. | 180/68.4 |
| 7,453,695 B2 * | 11/2008 | Ohnishi et al. | 361/689 |
| 7,505,194 B2 * | 3/2009 | Bryant | 359/291 |
| 2001/0014029 A1 | 8/2001 | Suzuki et al. | |
| 2005/0204761 A1 * | 9/2005 | Karikomi et al. | 62/228.1 |

FOREIGN PATENT DOCUMENTS

| | | | |
|---|---|---|---|
| JP | A 2001-308246 | | 11/2001 |
| JP | A 2001-339020 | | 12/2001 |
| JP | 02002233164 A | * | 8/2002 |
| JP | A 2004-103936 | | 4/2004 |
| JP | A-2004-349324 | | 12/2004 |
| JP | 02005073400 A | * | 3/2005 |
| JP | A 2005-191502 | | 7/2005 |

* cited by examiner

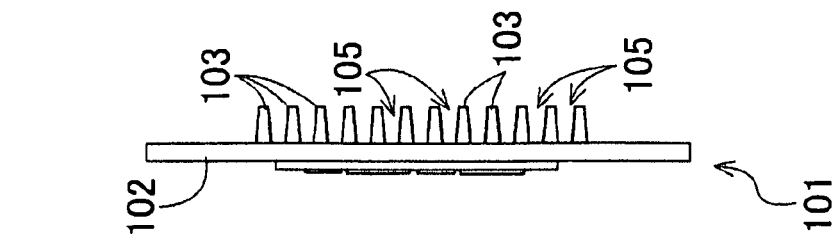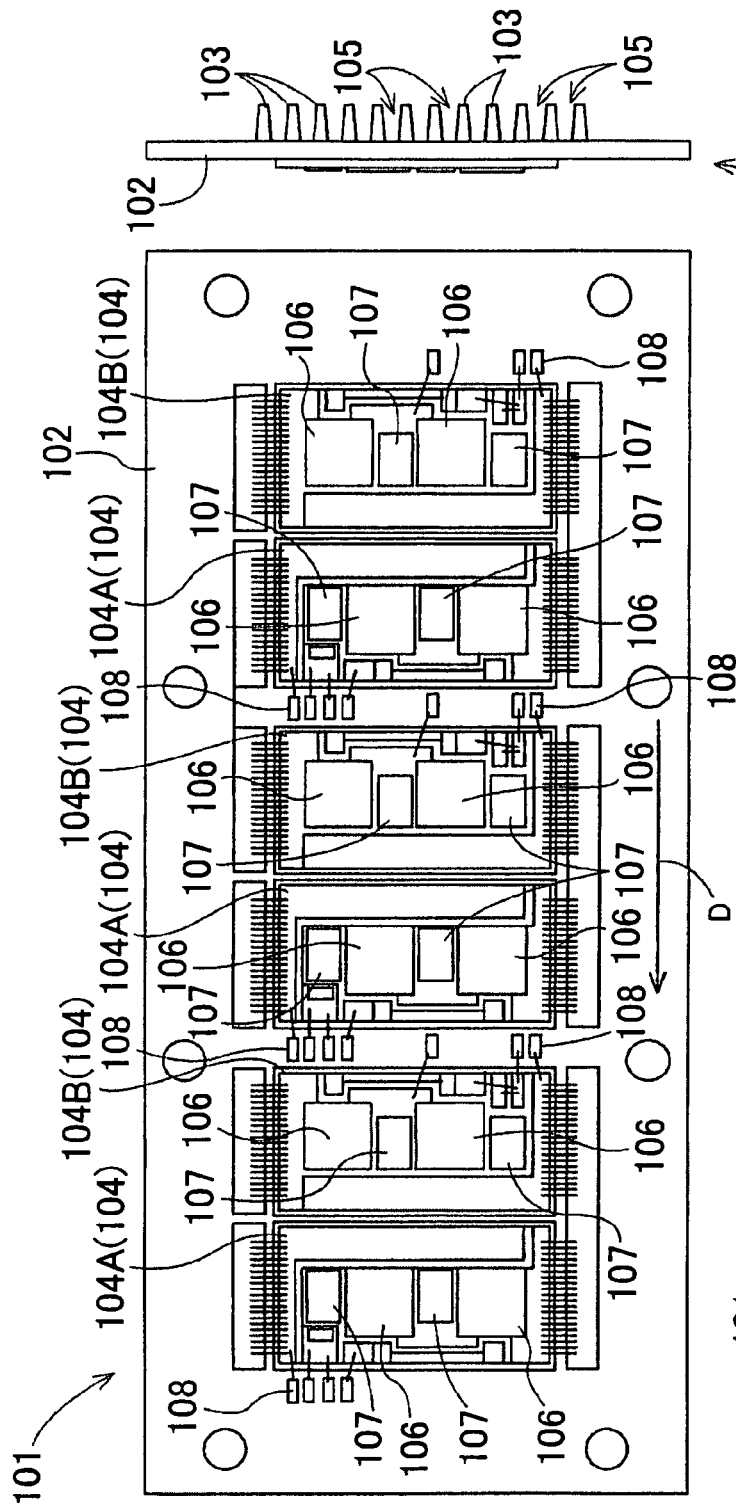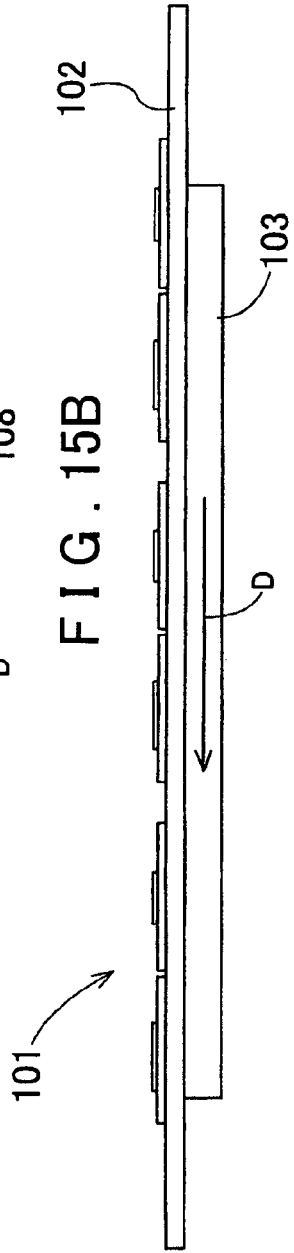

SEMICONDUCTOR MODULE AND INVERTER DEVICE

CROSS-REFERENCE TO RELATED APPLICATION

The disclosure of Japanese Patent Application No. 2007-135682 filed on May 22, 2007 including the specification, drawings and abstract is incorporated herein by reference in its entirety.

BACKGROUND

The present invention relates to a semiconductor and an inverter device.

There exists an inverter circuit for driving an electric motor of a hybrid vehicle, an electric vehicle, or the like. A semiconductor module that includes a switching element that forms the inverter circuit has a high heating value, and furthermore, requires downsizing. Therefore, a water-cooling system is often used as a cooling structure of the semiconductor module. As the configuration of the semiconductor module having such a water-cooling system, Japanese Patent Application Publication No. JP-A-2004-349324 (pages 6 and 7, and FIG. 5) discloses a configuration shown in FIGS. 15A, 15B and 15C for example. FIG. 15A is a plan view, FIG. 15B is a side view, and FIG. 15C is an elevational view. A semiconductor module 101 shown in FIGS. 15A, 15B and 15C includes a base plate 102 in which a fin 103 in stripe form is formed on a back surface, and six substrates 104 placed on an upper surface of the base plate 102. On the lower surface of the base plate 102, a water path cover (not shown) is provided to contact a bottom surface of the fin 103 (surface on a lower side of the fin 103 in FIG. 15B), whereby each coolant flow path 105 is formed between the plurality of fins 103. Therefore, in the semiconductor module 101, a coolant flow direction D is the longitudinal direction (horizontal direction in FIG. 15B) of the base plate 102. Six substrates 104 placed on the base plate 102 are arranged in line in the coolant flow direction D.

On each substrate 104, two each of an insulated gate bipolar transistor (IGBT) element as a switching element 106 and a diode element 107 are arranged. A connection terminal area 108, in which a wire bonding for electrically connecting the elements 106 and 107 and a control substrate (not shown) on each substrate 104 is performed, is arranged adjacent to each substrate 104. On the substrate 104, two switching elements 106 and two diode elements 107 are arranged alternately in line in a perpendicular direction with respect to the coolant flow direction D. The connection terminal area 108 is arranged on a side opposite to a side in which a pair of substrates 104A and 104B faces each other in the coolant flow direction D.

SUMMARY

In the configuration of the semiconductor module shown in FIG. 15A described above, all six substrates 104 are arranged in line in the coolant flow direction D. Therefore, a single flow of the coolant through each coolant flow path 105 formed between the plurality of fins 103 sequentially cools the plurality of (at least three) switching elements 106. Accordingly, there has been a problem in that the temperature of the coolant flowing through each coolant flow path 105 gradually rises, whereby the cooling performance for the switching element 106 on the downstream side decreases.

In addition, in the configuration of the semiconductor module shown in FIG. 15A described above, the connection terminal area 108 is arranged on the side opposite to the side in which the pair of substrates 104A and 104B face each other in the coolant flow direction D. Thus, since the switching element 106 of each of the pair of substrates 104A and 104B face each other without the connection terminal area 108 there between, the switching elements 106 that generate most of the heat on each substrate 104 are arranged in positions relatively close to each other. Therefore, a thermal interference by heat transmitted from the plurality of switching elements 106 easily occurs on the base plate 102, whereby a local temperature rise of the base plate 102 may occur. In this case, the cooling performance for the switching element 106 arranged in a high-temperature region of the base plate 102 may decrease.

The present invention provides a semiconductor module and an inverter device having a configuration that can suppress a thermal interference on a base plate caused by heat of a switching element included in each of a pair of substrates and thereby appropriately cool the switching element of all substrates. The present invention can also achieve various other advantages.

According to an exemplary aspect of the invention, a semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate. The coolant flow paths are formed such that coolant flows in a coolant flow direction. The switching element and the diode element are arranged in line in a perpendicular direction with respect to the coolant flow direction. The switching element and the connection terminal area are arranged in positions differing in the coolant flow direction in each of the substrates. A pair of substrates of the plurality of substrates is arranged in series in the coolant flow direction. The switching element of one of the substrates of the pair of substrates is arranged on one side in the perpendicular direction, and the diode element of the other substrate of the pair of substrates is arranged on the one side in the perpendicular direction. The connection terminal area of at least one substrate of the pair of substrates is arranged closer to a side that is between the pair of substrates with respect to the switching element of the at least one substrate of the pair of substrates.

According to an exemplary aspect of the invention, a semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate. The coolant flow paths are formed such that coolant flows in a coolant flow direction. The switching element and the diode element are arranged in line in a perpendicular direction with respect to the coolant flow direction. The switching element and the connection terminal area are arranged in positions differing in the coolant flow direction in each of the substrates. A pair of substrates of the plurality of substrates is arranged in series in the coolant flow direction. The connection terminal area is arranged on a first side in the perpendicular direction for one substrate of the pair of substrates and on a second side in the perpendicular direction for the other substrate of the pair of substrates. The diode element is arranged on the second side in the perpendicular direction for the one substrate of the pair of substrates and on the first side in the perpendicular direction for the other substrate of the pair of substrates. The connection terminal area of at least one substrate of the pair of substrates is arranged closer to a side that is between the pair of substrates with respect to the switching element of the at least one substrate of the pair of substrates.

BRIEF DESCRIPTION OF THE DRAWINGS

Various exemplary embodiments of the invention will be explained with reference to the drawings, wherein:

FIGS. 15A, 15B and 15C are diagrams showing the configuration of a conventional semiconductor module.

DETAILED DESCRIPTION OF EMBODIMENTS

1. First Embodiment

A first embodiment of the present invention will be described according to the drawings. In this embodiment, an example in which the present invention is applied to a semiconductor module 1 as an inverter device forming a three-phase AC inverter circuit will be described. FIG. 1 to FIG. 8 are diagrams for illustrating the configuration of the semiconductor module 1 according to this embodiment. Note that the configuration above a base plate 2 is omitted, with the exception of a substrate 3, in FIG. 1 to FIG. 5.

Figure 1:
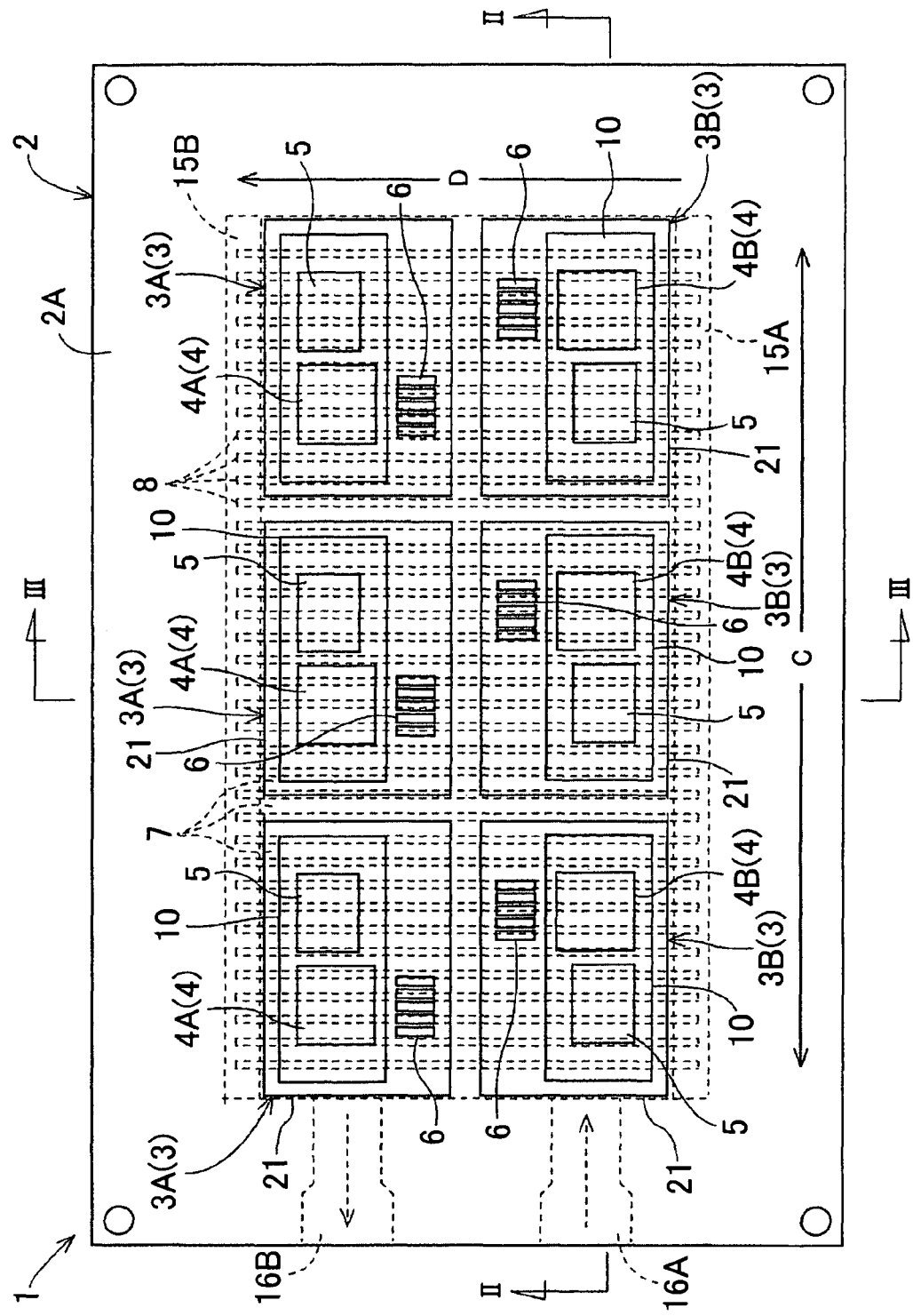
FIG. 1 is a plan view showing the configuration of a main section of a semiconductor module according to a first embodiment of the present invention.
Figure 6:
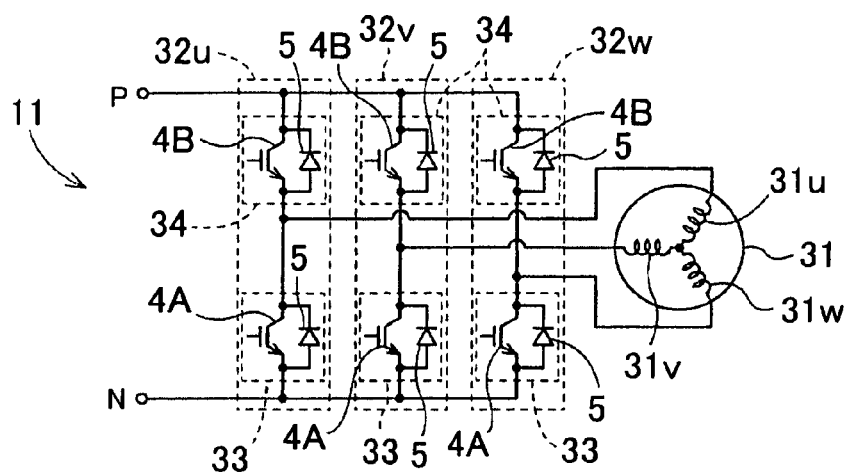
FIG. 6 is a wiring diagram of an inverter circuit according to the first embodiment of the present invention.
Figure 7:
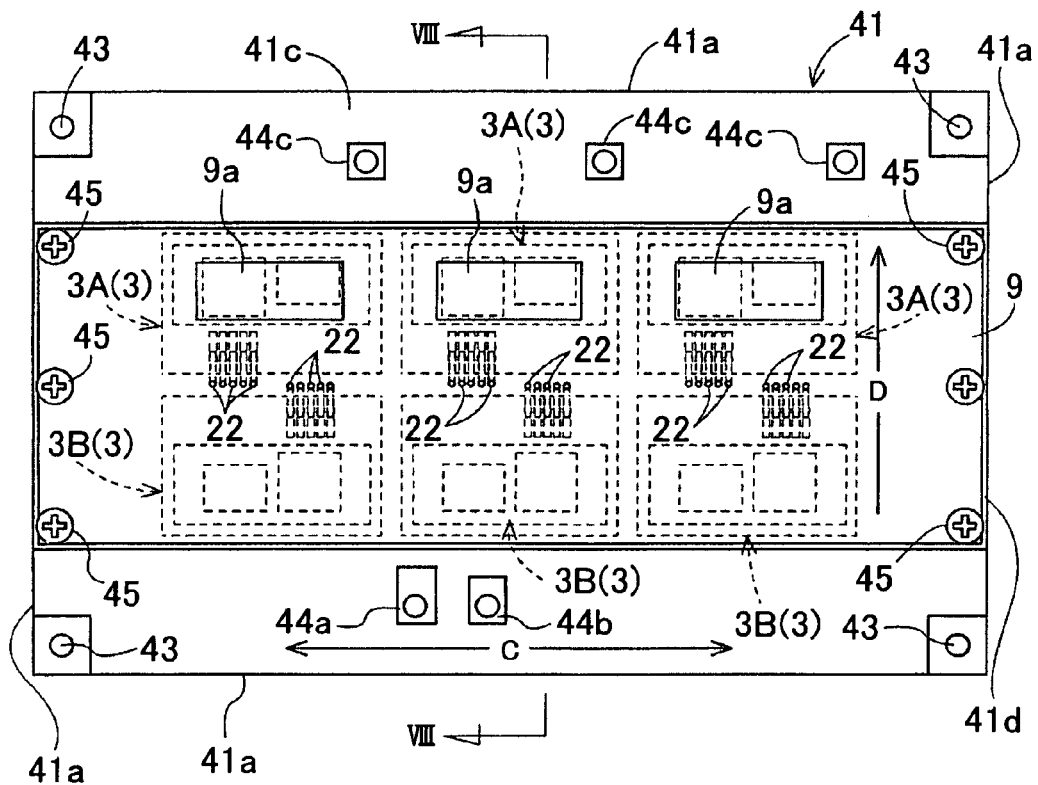
FIG. 7 is a plan view showing the entire configuration of the semiconductor module according to the first embodiment of the present invention.
Figure 8:
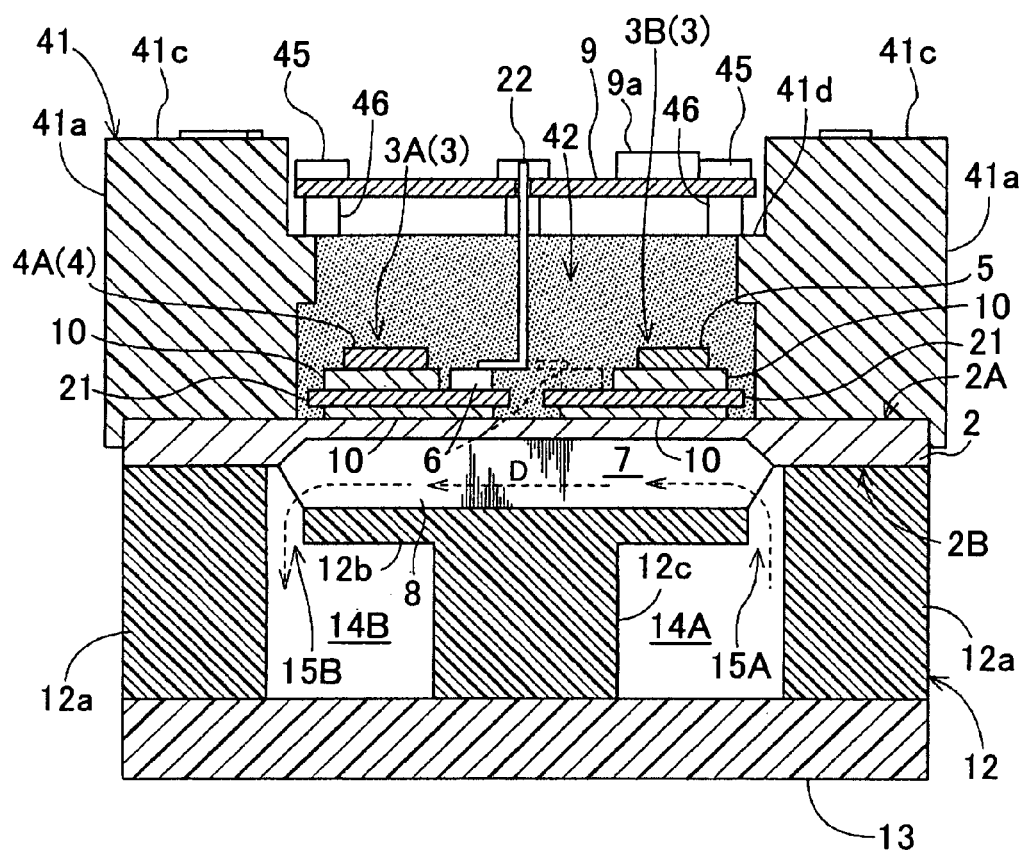
FIG. 8 is a sectional view along line VIII-VIII of FIG. 7.

As shown in the drawings, the semiconductor module 1 has a cooling structure including a coolant flow path 7 for cooling the substrate 3 placed on an upper surface 2A of the base plate 2, particularly a switching element 4 having the highest heating value. As shown in FIG. 6, the semiconductor module 1 forms an inverter circuit 11 for driving a three-phase AC electric motor 31. Therefore, as shown in FIG. 1, six substrates 3, each including the switching element 4 and a diode element 5, are placed on the upper surface 2A of the base plate 2. Further, in the semiconductor module 1, as shown in FIG. 7 and FIG. 8, a case 41 is placed so as to surround six substrates 3 on the base plate 2, and a control substrate 9 for an operation control and the like of the switching element 4 on each substrate 3 is supported by the case 41. The configuration of each section of the semiconductor module 1 will be described below in detail.

1-1. Cooling Structure of Substrate

First, the cooling structure of the substrate 3 in the semiconductor module 1 will be described according to FIG. 1 to FIG. 5. As shown in FIG. 1, the semiconductor module 1 includes the base plate 2, six substrates 3 placed on the upper surface 2A of the base plate 2, and a coolant flow path 7 provided to contact a lower surface 2B of the base plate 2. In the coolant flow path 7, a plurality of fins 8 is provided as a parallel flow formation unit that forms parallel flows of the coolant in a specific direction. As shown in FIG. 2 to FIG. 5, the plurality of fins 8 are arranged to be parallel with each other along the lower surface 2B of the base plate 2. Each fin 8 is formed in a plate shape having a specific thickness and provided perpendicular to the lower surface 2B of the base plate 2, and is formed integrally with the base plate 2 by a cutting process and the like of the lower surface 2B of the base plate 2. The intervals between the plurality of fins 8 are approximately constant, and the height of the plurality of fins 8 is also constant. With the fin 8 being provided in this manner, the flow of the coolant introduced into the coolant flow path 7 becomes a parallel flow which is parallel with a direction defined by the parallel flow formation unit, i.e., a direction along the fin 8. In the example shown in the drawings, flows of the coolant parallel with each other are formed between the plurality of fins 8. As shown in FIG. 1, the direction parallel with the plurality of fins 8 (upward direction in FIG. 1) is the coolant flow direction D. The direction perpendicular to the coolant flow direction D is a perpendicular direction C with respect to the coolant flow direction (horizontal direction in FIG. 1, hereinafter referred to simply as "perpendicular direction C"). Note that, in this embodiment, the upper surface 2A of the base plate 2 corresponds to one surface of the present invention and the lower surface 2B corresponds to the other surface of the present invention.

Figure 2:
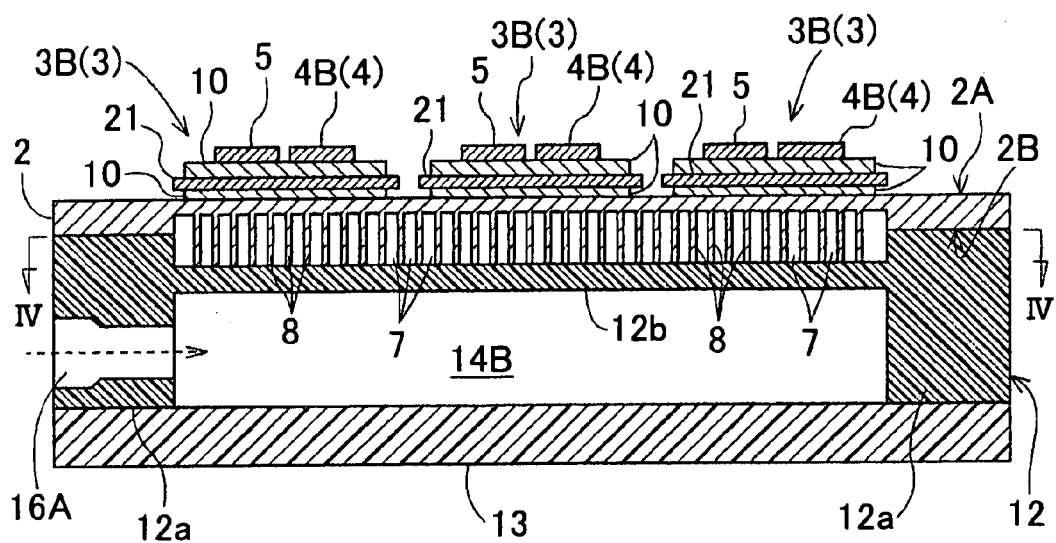
FIG. 2 is a sectional view along line II-II of FIG. 1.
Figure 3:
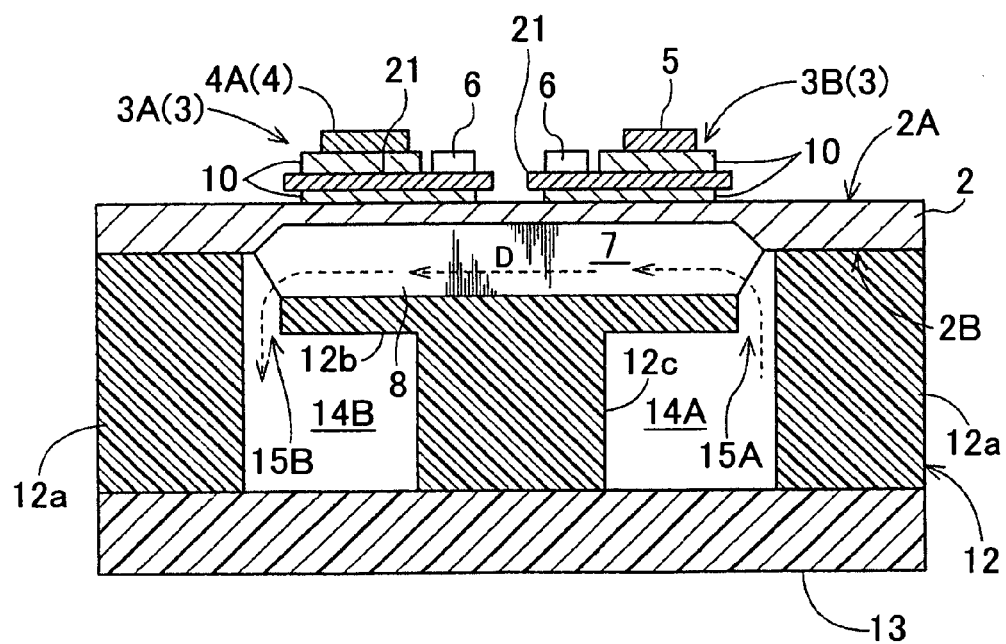
FIG. 3 is a sectional view along line III-III of FIG. 1.
Figure 5:
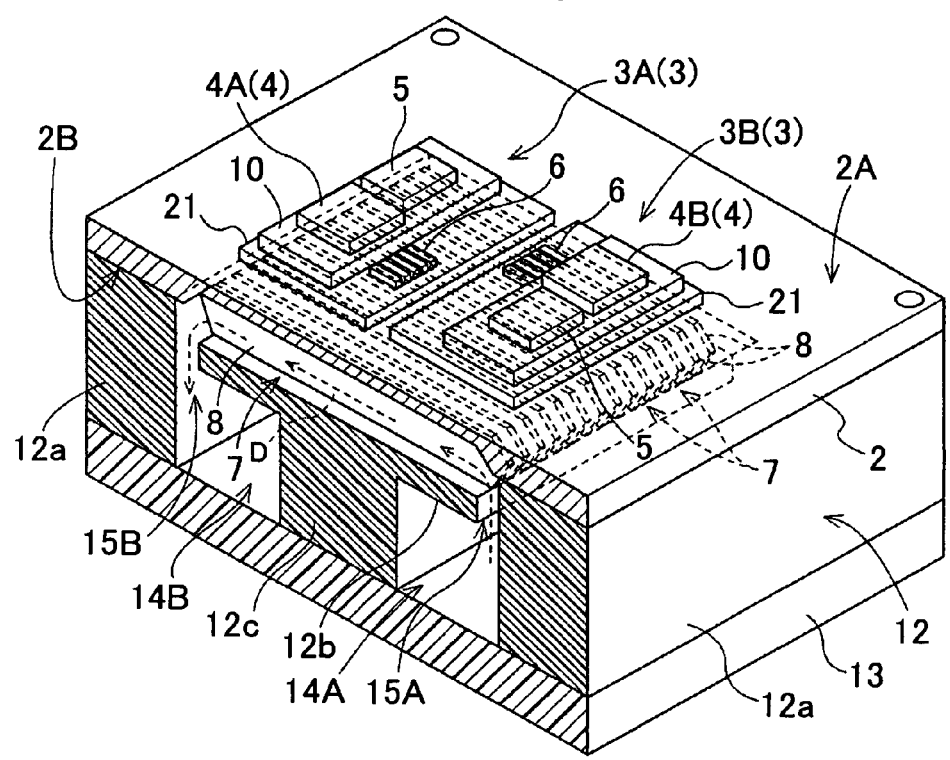
FIG. 5 is a sectional perspective view of the semiconductor module according to the first embodiment of the present invention.

As shown in FIG. 2, FIG. 3 and FIG. 5, the base plate 2 is supported by a water path formation member 12. A bottom plate member 13 in a flat plate shape is provided to cover the bottom surface of the water path formation member 12. The water path formation member 12 externally has a rectangular parallelepiped form in which the planar shape is approximately the same as that of the base plate 2. The water path formation member 12 has a circumference wall 12a surrounding the outer circumference thereof, a contact plate section 12b formed on the inner side of the circumference wall 12a and a partition wall 12c. The upper surface of the circumference wall 12a is in contact with the lower surface 2B of the base plate 2, and the lower surface of the circumference wall 12a is in contact with the bottom plate member 13. The contact plate section 12b is a plate-shaped section provided so as to contact the bottom surface of the fin 8 (lower surface in FIG. 2 and FIG. 3). Thus, the coolant flow path 7 is formed of each a plurality of long spaces surrounded by the plurality of fins 8 and the contact plate section 12b. Therefore, the plurality of parallel flows of the coolant is formed by the coolant flowing through each of the plurality of coolant flow paths 7 partitioned by the plurality of fins 8. The partition wall 12c is a wall-shaped member that is provided along the perpendicular direction C and partitions the space below the contact plate section 12b into two spaces. The space on the right side of the partition wall 12c in FIG. 3 and FIG. 5 is an inflow side coolant reservoir 14A and the space on the left side of the partition wall 12c is an outflow side coolant reservoir 14B.

Figure 4:
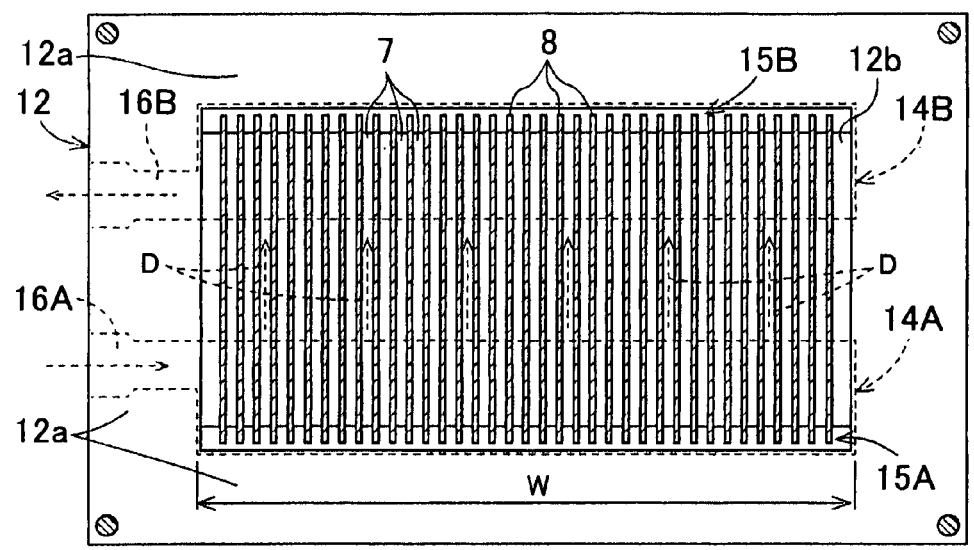
FIG. 4 is a sectional view along line IV-IV of FIG. 2.

The inflow side coolant reservoir 14A is connected with the coolant flow path 7 via an inflow side reducer section 15A, and the outflow side coolant reservoir 14B is connected with the coolant flow path 7 via an outflow side reducer section 15B. The inflow side reducer section 15A and the outflow side reducer section 15B are formed by a gap between the peripheral wall 12a and the contact plate section 12b of the water path formation member 12. As shown in FIG. 4, the inflow side reducer section 15A and the outflow side reducer section 15B are both opening sections having a long slit shape in the perpendicular direction C. The inflow side coolant reservoir 14A, the outflow side coolant reservoir 14B, the inflow side reducer section 15A, and the outflow side reducer section 15B all have the same length in the perpendicular direction C as a full width W of the coolant flow path 7.

The coolant flows in a manner described below. That is, as shown in FIG. 4, the coolant enters from an inflow path 16A, and is carried to the inflow side coolant reservoir 14A by an outlet pressure and the like of a pump (not shown). The coolant filled in the inflow side coolant reservoir 14A passes through the inflow side reducer section 15A and flows in the coolant flow path 7 between the plurality of fins 8, as shown in FIG. 3 to FIG. 5. When passing through the coolant flow path 7, the coolant performs the heat exchange with the base plate 2 and the fin 8, whereby the substrate 3 on the base plate 2 is cooled. The coolant, which has passed through the coolant flow path 7, passes through the outflow side reducer section 15B to be sent to the outflow side coolant reservoir 14B. Then, the coolant filled in the outflow side coolant reservoir 14B passes through an outflow path 16B to be discharged. As described above, the coolant flow direction D in the coolant flow path 7 is a direction parallel with the plurality of fins 8. In order for the coolant to efficiently perform the heat exchange with the base plate 2 and the fin 8, the base plate 2 and the fin 8 are preferably formed of metal having high thermal conductivity (such as copper, for example). In this embodiment, a cooling liquid used for a vehicle, in which ethylene glycol and the like are added to water and the like is used as the coolant.

1-2. Arrangement Configuration of Substrate

Next, the arrangement configuration of the substrate 3 in the semiconductor module 1, which is the main section in the present invention, will be described according to FIG. 1. In this embodiment, six substrates 3 are arranged on the upper surface 2A of the base plate 2, such that two substrates 3 are aligned in line in the coolant flow direction D and three substrates 3 are aligned in line in the perpendicular direction C. Those six substrates 3 form the inverter circuit 11 as described below.

The substrate 3 includes a lower arm substrate 3A having a lower arm switching element 4A forming a lower arm 33, and an upper arm substrate 3B having an upper arm switching element 4B forming an upper arm 34 of the inverter circuit 11 (see FIG. 6). Among six substrates 3, three substrates arranged on the downstream side (upper side in FIG. 1) of the coolant flow direction D is the lower arm substrate 3A, and three substrates arranged on the upstream side (lower side in FIG. 1) of the coolant flow direction D is the upper arm substrate 3B. Six substrates 3 are arranged as three sets of substrates 3 aligned in the perpendicular direction C, each set being formed of (a pair of) the lower arm substrate 3A and the upper arm substrate 3B as a pair arranged in line in the coolant flow direction D (aligned in the vertical direction in FIG. 1). Accordingly, each of the pair of the substrates 3A and 3B are arranged on the upstream side and the downstream side as a pair in the cooling structure as well. Note that the concept of the lower arm and the upper arm will be described later according to FIG. 6. In the description below, the lower arm substrate 3A and the upper arm substrate 3B are generically referred to simply as "substrate 3," and the lower arm switching element 4A and the upper arm switching element 4B are generically referred to simply as "switching element 4."

Each substrate 3 includes one each of the switching element 4, the diode element 5, and the connection terminal area 6. Specifically, in the substrate 3, a copper foil 10 is provided on both the upper and lower surfaces of a substrate body 21 formed of an insulating substrate. The copper foil 10 on the lower side is secured to a base plate 2 by a solder (not shown), and the copper foil 10 on the upper side secures thereon the switching element 4 and the diode element 5 via a solder (not shown). The switching element 4 is specifically an insulated gate bipolar transistor (IGBT) element, and the diode element 5 is specifically a free wheel diode (FWD) element. Therefore, the switching element 4 has the highest heating value in the substrate 3. The connection terminal area 6 is provided to be placed directly on the substrate body 21 in a region in which the upper side copper foil 10 is not provided. Although omitted in FIG. 1, a lead pin 22 (see FIG. 7 and FIG. 8) for electrically connecting the switching element 4 and the control substrate 9 is secured to the connection terminal area 6 via a solder. In the connection terminal area 6, a wire bonding for electrically connecting the switching element 4 and the lead pin 22 is also performed.

The arrangement of the switching element 4, the diode element 5, and the connection terminal area 6 on each substrate 3 is as follows. That is, as shown in FIG. 1, the switching element 4 and the diode element 5 are arranged in line in the perpendicular direction C (horizontal direction in FIG. 1). In the example shown in the drawing, the switching element 4 has an external shape slightly larger than that of the diode element 5. The central position of the diode element 5 in the coolant flow direction D is arranged in a position deflected to one side of the coolant flow direction D (side apart from the connection terminal area 6) with respect to the central position of the switching element 4 in the coolant flow direction D, whereby the edges of the switching element 4 and the diode element 5 on one side in the coolant flow direction D are in a single straight line. In the example shown in FIG. 1, "one side in the coolant flow direction D" refers to the downstream side of the coolant flow direction D (upper side in FIG. 1) for the lower arm substrate 3A, and to the upstream side of the coolant flow direction D (lower side in FIG. 1) for the upper arm substrate 3B. The switching element 4 and the connection terminal area 6 are arranged to differ in positions in the coolant flow direction D. Specifically, the connection terminal area 6 is arranged on the other side (side that is between the lower arm substrate 3A and the upper arm substrate 3B) in the coolant flow direction D in a position approximately the same as that of the switching element 4 in the perpendicular direction C and adjacent to the switching element 4. In the example shown in FIG. 1, "the other side in the coolant flow direction D" refers to the upstream side of the coolant flow direction D (lower side in FIG. 1) for the lower arm substrate 3A, and to the downstream side of the coolant flow direction D (upper side in FIG. 1) for the upper arm substrate 3B. In the example shown in the drawing, the substrate body 21 of each substrate 3 is formed in a plate shape having a long rectangular planar shape in the perpendicular direction C in accordance with the arrangement of each element and the like.

As described above, in the relation between the pair of the lower arm substrate 3A and the upper arm substrate 3B arranged in line in the coolant flow direction D (in line in the vertical direction in FIG. 1), i.e., the relation between the pair of substrates 3 forming each set, the switching element 4 is arranged on one side in the perpendicular direction C in one substrate 3, and the diode element 5 is arranged on the one side in the perpendicular direction C in the other substrate 3. Specifically, in the lower arm substrate 3A, the switching element 4 is arranged on the left side (first side) in the perpendicular direction C (left side in FIG. 1), and the diode element 5 is arranged on the right side (second side) in the perpendicular direction C (right side in FIG. 1). On the other hand, in a manner opposite to that of the lower arm substrate 3A, in the upper arm substrate 3B, the diode element 5 is arranged on the left side in the perpendicular direction C, and the switching element 4 is arranged on the right side in the perpendicular direction C. In this embodiment, in order to achieve an arrangement of the pair of the lower arm substrate 3A and the upper arm substrate 3B that satisfies the relation, the pair of substrates 3A and 3B has identical configurations, and the pair of substrates 3A and 3B are arranged to be point symmetrical. In this case, the pair of substrates 3A and 3B are arranged to be point symmetrical with respect to the central position in both the coolant flow direction D and the perpendicular direction C of the pair of substrates 3A and 3B as the reference.

The pair of substrates 3A and 3B arranged in line in the coolant flow direction D has an arrangement configuration such as that described above, whereby the lower arm switching element 4A and the upper arm switching element 4B of the pair of substrates 3A and 3B are arranged to be deflected to differ in positions in the perpendicular direction C. Therefore, regarding each of the plurality of parallel flows flowing through the plurality of coolant flow paths 7 formed between the fins 8, a single flow of the coolant flowing through one coolant flow path 7 may basically cool only one of the upper arm switching element 4B and the lower arm switching element 4A. Therefore, both of the switching elements 4A and 4B of the pair of substrates 3A and 3B can be appropriately cooled. That is, it can suppress a decrease in the cooling performance for the lower arm switching element 4A on the downstream side, due to a configuration in which a single flow of the coolant having a higher temperature after cooling the upper arm switching element 4B on the upstream side in the coolant flow direction D further cools the lower arm switching element 4A on the downstream side.

In this embodiment, both of the connection terminal area 6 of the pair of substrates 3A and 3B are arranged on the other substrate 3 side with respect to the switching element 4 of each substrate 3. Specifically, in the lower arm substrate 3A, the connection terminal area 6 is arranged on the upper arm substrate 3B side with respect to the lower arm switching element 4A. In the upper arm substrate 3B, the connection terminal area 6 is arranged on the lower arm substrate 3A side with respect to the upper arm switching element 4B. Thereby, the lower arm switching element 4A and the upper arm switching element 4B are arranged with both of the connection terminal areas 6 of the pair of substrates 3A and 3B there between in the coolant flow direction D, whereby the switching elements 4A and 4B which generate most of the heat, are arranged in positions apart from each other in the pair of substrates 3A and 3B. Thus, a thermal interference on the base plate 2 caused by heat transmitted from each of the switching elements 4A and 4B of the pair of substrates 3A and 3B can be suppressed.

Note that, in this embodiment, as described above, the connection terminal area 6 is arranged in a position approximately the same as that of the switching element 4 in the perpendicular direction C, whereby the connection terminal area 6 of each of the pair of substrates 3A and 3B is arranged on one side in the perpendicular direction C in one substrate 3 and is arranged on the other side in the perpendicular direction C in the other substrate 3, in a manner similar to the switching element 4 of each of the pair of substrates 3A and 3B. Specifically, the connection terminal area 6 is arranged on the left side in the perpendicular direction C (left side in FIG. 1) in the lower arm substrate 3A, and is arranged on the right side in the perpendicular direction C (right side in FIG. 1) in the upper arm substrate 3B. With the connection terminal area 6 arranged in this manner, the connection terminal area 6 of the lower arm substrate 3A and the connection terminal area 6 of the upper arm substrate 3B can be aligned alternately along the perpendicular direction C. Thus, as shown in FIG. 7, the plurality of lead pins 22 secured to the connection terminal area 6 of each substrate 3 is easily arranged in one line in the perpendicular direction C. Thus, the wiring pattern of the control substrate 9 described later can be simplified, and a soldering step of the lead pin 22 and the control substrate 9 can be simplified.

1-3. Configuration of Inverter Circuit

Next, the electrical configuration of the inverter circuit 11 formed of the semiconductor module 1 according to this embodiment will be described. As shown in FIG. 6, the inverter circuit 11 is a circuit for driving the three-phase AC electric motor 31. That is, the inverter circuit 11 includes a U-phase arm 32$u$, a V-phase arm 32$v$, and a W-phase arm 32$w$ respectively provided corresponding to a U-phase coil 31$u$, a V-phase coil 31$v$, and a W-phase coil 31$w$ (corresponding to each phase of a U-phase, a V-phase, and a W-phase) of the three-phase AC electric motor 31. The arms 32$u$, 32$v$, and 32$w$ for each phase each have a pair of the lower arm 33 and the upper arm 34 capable of operating in a complementary manner. The lower arm 33 has the lower arm switching element 4A formed of the IGBT element, and the diode element 5 connected in parallel between an emitter and a collector of the lower arm switching element 4A. Similarly, the upper arm 34 has the upper arm switching element 4B formed of the IGBT element, and the diode element 5 connected in parallel between an emitter and a collector of the upper arm switching element 4B. In the diode element 5, an anode is connected to the emitter of the switching elements 4A and 4B, and a cathode is connected to the collector of the switching elements 4A and 4B.

The pair of lower arm 33 and the upper arm 34 for each phase are connected in line such that the lower arm 33 is on the side of the negative electrode N which is the ground, and the upper arm 34 is on the side of the positive electrode P which is the source voltage. Specifically, the emitter of the lower arm switching element 4A is connected to the negative electrode N, and the collector of the upper arm switching element 4B is connected to the positive electrode P. That is, the lower arm switching element 4A is the lower side switch, and the upper arm switching element 4B is the high side switch. The collector of the lower arm switching element 4A and the emitter of the upper arm switching element 4B are connected to each of the U-phase coil 31$u$, the V-phase coil 31$v$, and the W-phase coil 31$w$ of the electric motor 31 corresponding to each of the arms 32$u$, 32$v$, and 32$w$.

In the relation with each substrate 3 of the semiconductor module 1, the lower arm switching element 4A and the diode element 5 of the lower arm substrate 3A form the lower arm 33, and the upper arm switching element 4B and the diode element 5 of the upper arm substrate 3B form the upper arm 34 of the inverter circuit 11. That is, of six substrates 3 arranged on the base plate 2, the three lower arm substrates 3A arranged on the downstream side in the coolant flow direction D (upper side in FIG. 1) each form the lower arm 33 of the U-phase arm 32u, the V-phase arm 32v, and the W-phase arm 32w, and the three upper arm substrates 3B arranged on the upstream side in the coolant flow direction D (lower side in FIG. 1) each form the upper arm 34 of the U-phase arm 32u, the V-phase arm 32v, and the W-phase arm 32w. On the base plate 2, the pair of (the set of) the lower arm substrate 3A and the upper arm substrate 3B arranged in line in the coolant flow direction D (in line in the vertical direction in FIG. 1) each form one of the U-phase arm 32u, the V-phase arm 32v, and the W-phase arm 32w. Thus, for example, the pair of substrates 3A and 3B on the left side in the perpendicular direction C (left side in FIG. 1) form the U-phase arm 32u, the pair of substrates 3A and 3B in the center in the perpendicular direction C form the V-phase arm 32v, and the pair of substrates 3A and 3B on the right side in the perpendicular direction C (right side in FIG. 1) form the W-phase arm 32w.

1-4. Upper Section Configuration of Semiconductor Module

Next, the upper section configuration provided above the base plate 2 in the semiconductor module 1 will be described. As shown in FIG. 7 and FIG. 8, the semiconductor module 1 has a resin case 41 placed on the base plate 2 and provided to surround six substrates 3 described above, and the control substrate 9 is supported above the six substrates 3 by the case 41 as the upper section configuration.

The case 41 externally has a rectangular parallelepiped form in which the planar shape is a rectangular shape slightly larger than that of the base plate 2. The case 41 forms a storage space 42 which stores six substrates 3 placed on the base plate 2 and has a circumference wall section 41a provided to surround the circumference of the storage space 42. Note that, a filler such as an epoxy resin fills the storage space 42 and is hardened in the storage space 42. Therefore, six substrates 3 placed on the base plate 2 and the case 41 are eventually integrated. As shown in FIG. 7, a tight hole 43, into which tightening unit such as a bolt for fastening the case 41 on the base plate 2 is inserted, is provided to the four corners of the case 41.

The upper surface of the circumference wall section 41a is formed of two surfaces, a first upper surface 41c and a second upper surface 41d, having different heights. The first upper surface 41c is a long rectangular surface in the perpendicular direction C provided to each of the upstream side and the downstream side of the coolant flow direction D (upper side and the lower side in FIG. 7). The second upper surface 41d is a surface one step lower than the first upper surface 41c. The first upper surface 41c of the case 41 is provided with a positive terminal 44a, a negative terminal 44b, and an output terminal 44c as external lead-out terminals of a lead frame (not shown) disposed in the case 41 to be electrically connected to each substrate 3. One each of the positive terminal 44a and the negative terminal 44b are provided to the first upper surface 41c on the lower side in FIG. 7, and three output terminals 44c are provided to the first upper surface 41c on the upper side in FIG. 7. The positive terminal 44a is electrically connected to the positive electrode P, and the negative terminal 44b is electrically connected to the negative electrode N (see FIG. 6). The three output terminals 44c are each electrically connected to the U-phase coil 31u, the V-phase coil 31v, and the W-phase coil 31w (see FIG. 6) of the three-phase AC electric motor 31.

The control substrate 9 is arranged above the second upper surface 41d of the case 41. Therefore, internal thread portion (not shown) to which a bolt 45 for fastening the control substrate 9 is screwed is formed in a plurality of positions near the edges on both sides in the perpendicular direction C of the second upper surface 41d. The control substrate 9 is tightened and secured to the case 41 by the plurality of bolts 45. The control substrate 9 is arranged to be parallel with the surfaces with a certain interval by a spacer 46 arranged between the control substrate 9 and the upper surface of the second upper surface 41d.

The plurality of lead pins 22 secured to the connection terminal area 6 of each substrate 3 penetrates the control substrate 9, and is soldered and fastened to the wiring pattern (not shown) provided on the upper surface of the control substrate 9. In this embodiment, the lead pins 22 of each of six substrates 3 are arranged in one line in the perpendicular direction C. With the arrangement in which the lead pins 22 are aligned in one line on the control substrate 9, the wiring pattern of the control substrate 9 can be simplified, and the soldering step of the lead pin 22 and the control substrate 9 can be simplified. The control substrate 9 is a substrate in which a control circuit for driving the inverter circuit 11 is formed, and is formed of a print substrate mounted with a specific circuit part. The lead pin 22 electrically connects the control substrate 9 and the plurality of substrates 3 arranged on the base plate 2.

Further, on the control substrate 9, a temperature detection circuit 9a functioning as a temperature detection unit that detects the temperature of the switching element 4 of each substrate 3 is mounted. The temperature detection circuit 9a is an arithmetic circuit that detects the temperature of each switching element 4 by detecting the voltage between the anode and the cathode of a temperature detection diode (not shown) provided to the switching element 4 and performing a specific arithmetic operation. In this embodiment, only the lower arm switching element 4A of the lower arm substrate 3A, arranged on the downstream side of the coolant flow direction D, of the switching elements 4A and 4B of each of the pair of substrates 3A and 3B is provided with the temperature detection circuit 9a. That is, the temperature detection circuit 9a is omitted in the upper arm switching element 4B of the upper arm substrate 3B arranged on the upstream side of the coolant flow direction D. Thus, in the semiconductor module 1, wherein the temperature detection circuit 9a provided to the lower arm switching element 4A arranged on the downstream side of the coolant flow direction D performs the temperature detection for a temperature management of both of the switching elements 4A and 4B of the pair of substrates 3A and 3B. Note that, the control substrate 9 monitors the temperature of the switching elements 4A and 4B to be kept within a specific operation security temperature range, and performs control to stop the operation and the like of the switching elements 4A and 4B when the temperature exceeds the temperature range, for example as the temperature management of the switching elements 4A and 4B.

The temperature detection circuit 9a is provided only to the lower arm switching element 4A arranged on the downstream side of the coolant flow direction D in this manner, whereby the number of the temperature detection circuits 9a can be reduced by half of that of a case where the temperature detection circuit 9a is provided to the upper arm switching element 4B as well. Normally, the temperature of the coolant is higher on the downstream side than on the upstream side of the coolant flow direction D, whereby the lower arm switching element 4A arranged on the downstream side is likely to have a higher temperature than that of the upper arm switching element 4B arranged on the upstream side. Therefore, even if the temperature management is performed using only the temperature detection result of the lower arm switching element 4A, the temperature of the upper arm switching element 4B does not exceed the specific operation security temperature range and thereby does not cause a problem. Further, in this embodiment, since only the lower arm switching element 4A is arranged on the downstream side of the coolant flow direction D, the configuration of the temperature detection circuit 9a can be simplified. That is, all temperature detection circuits 9a are used for the temperature detection of the lower arm switching element 4A, whereby each temperature detection circuit 9a can be an arithmetic circuit in which the electric potential of the negative electrode N (ground) is the reference. Therefore, the configuration of the temperature detection circuit 9a can be simplified compared to the temperature detection circuit 9a in which the electric potential of the positive electrode P is the reference. Thus, the cost of the semiconductor module 1 can be reduced.

2. Second Embodiment

Figure 9:
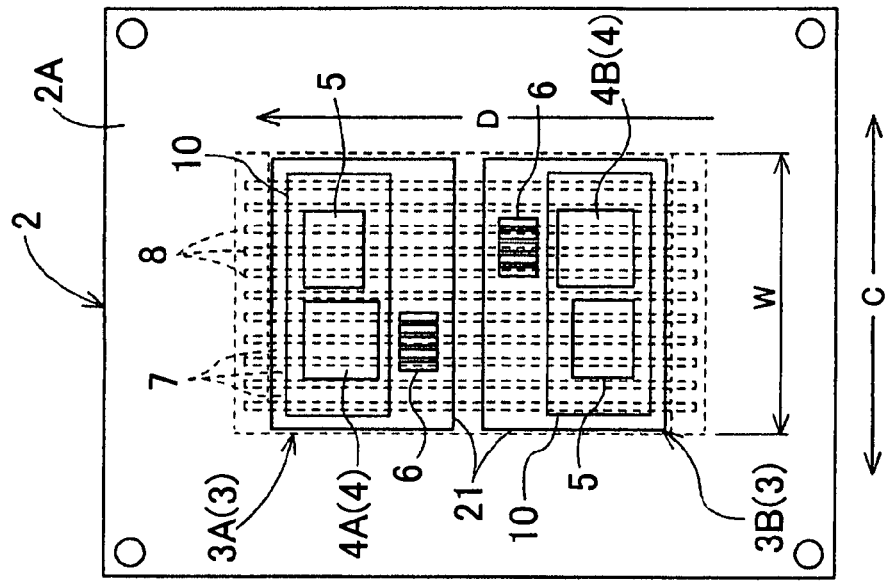
FIG. 9 is a plan view showing the configuration of a main section of a semiconductor module according to a second embodiment of the present invention.

A second embodiment of the present invention will be described according to the drawing. FIG. 9 is a plan view showing the configuration of the main section of the semiconductor module 1 according to this embodiment. As shown in the drawing, the semiconductor module 1 according to this embodiment is formed of only one set of the pair of the lower arm substrate 3A and the upper arm substrate 3B placed on one base plate 2. That is, the number of the substrates 3 placed on one base plate 2 in the semiconductor module 1 according to this embodiment differs from that of the first embodiment. Note that the configuration is similar to that of the first embodiment, unless otherwise mentioned in this embodiment.

Therefore, in the semiconductor module 1 according to this embodiment, the width of the base plate 2 in the perpendicular direction C is narrower, and the full width W of the coolant flow path 7 is narrower compared to the semiconductor module 1 according to the first embodiment. Although omitted in the drawing, the shape of the case 41 matches the shape of the base plate 2, and the control substrate 9 is formed to be suitable for controlling the pair of substrates 3A and 3B in the upper section configuration of the semiconductor module 1. Three semiconductor modules 1 can be used in combination to form the inverter circuit 11 similar to that of the first embodiment. When the semiconductor module 1 is used alone, a chopper circuit can be formed by a combination with a coil, a capacitor, and the like, for example. Although omitted in the drawing, forming the semiconductor module 1 with two sets or four or more sets of the pair of the lower arm substrate 3A and the upper arm substrate 3B placed on one base plate 2 is also one preferred embodiment of the present invention. For example, in the case of forming a single-phase AC inverter circuit and the like, it is preferable to place two sets of the pair of lower arm substrate 3A and the upper arm substrate 3B on one base plate 2.

3. Third Embodiment

Figure 10:
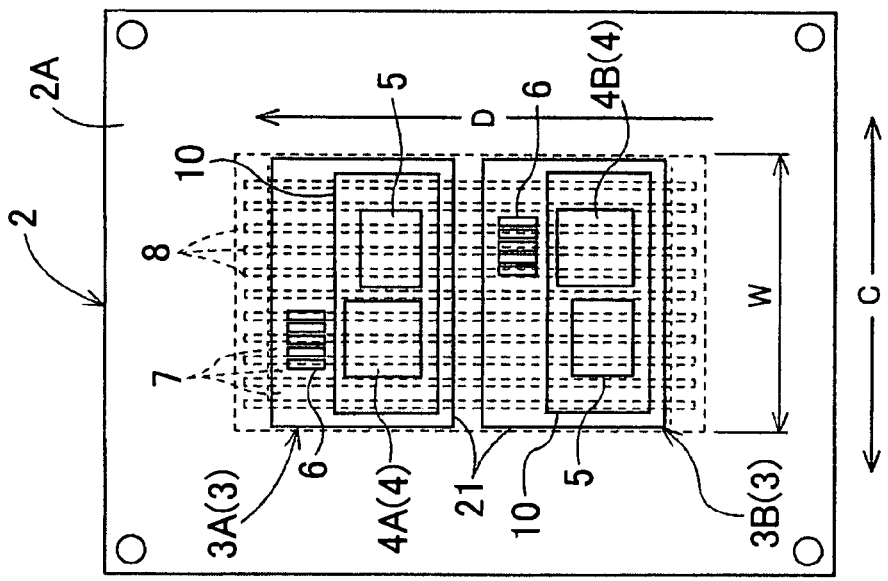
FIG. 10 is a plan view showing the configuration of a main section of a semiconductor module according to a third embodiment of the present invention.

A third embodiment of the present invention will be described according to the drawing. FIG. 10 is a plan view showing the configuration of the main section of the semiconductor module 1 according to this embodiment. In the semiconductor module 1 according to this embodiment, the arrangement configuration of the substrate 3 differs from that of the first and second embodiments. In order to simplify the drawing and the like, an example of a configuration in which only one set of the pair of substrates 3A and 3B is placed on one base plate 2, as in the second embodiment, will be described. However, a configuration in which a plurality of the sets of the pair of the substrates 3A and 3B are placed on the base plate 2, as in the first embodiment, may obviously be applied in a similar manner. Note that the configuration is similar to that of the first embodiment or the second embodiment, unless otherwise mentioned in this embodiment.

In the semiconductor module 1 according to this embodiment, the arrangement of the switching element 4, the diode element 5, and the connection terminal area 6 in the upper arm substrate 3B is the same as that of the first and second embodiments, but the arrangement of the switching element 4, the diode element 5, and the connection terminal area 6 in the lower arm substrate 3A is different. That is, in the lower arm substrate 3A, the switching element 4 is arranged on the upper arm substrate 3B side with respect to the connection terminal area 6 in this embodiment. Therefore, in the semiconductor module 1, only the connection terminal area 6 of the upper arm substrate 3B, which is one of the pair of substrates 3A and 3B, is arranged on the lower arm substrate 3A side with respect to the switching element 4B of the substrate 3B. Note that, since the diode element 5 of the lower arm substrate 3A is arranged in line with the switching element 4 in the perpendicular direction C, the diode element 5 is arranged on the upper arm substrate 3B side with respect to the connection terminal area 6 in a manner similar to the switching element 4. The positional relation between the switching element 4 and the diode element 5 in the perpendicular direction C in each of the substrates 3A and 3B is similar to that of the first and second embodiments.

Therefore, in the semiconductor module 1, the lower arm substrate 3A and the upper arm substrate 3B do not have the same configuration. The lower arm substrate 3A has a configuration in which the positional relation of the upper arm substrate 3B is reversed in the perpendicular direction C as in a mirror. The arrangement configuration of the substrate 3 of the semiconductor module 1 according to this embodiment is achieved by arranging the lower arm substrate 3A and the upper arm substrate 3B in line such that the switching elements 4 are both positioned on the upstream side of the coolant flow direction D.

4. Fourth Embodiment

Figure 11:
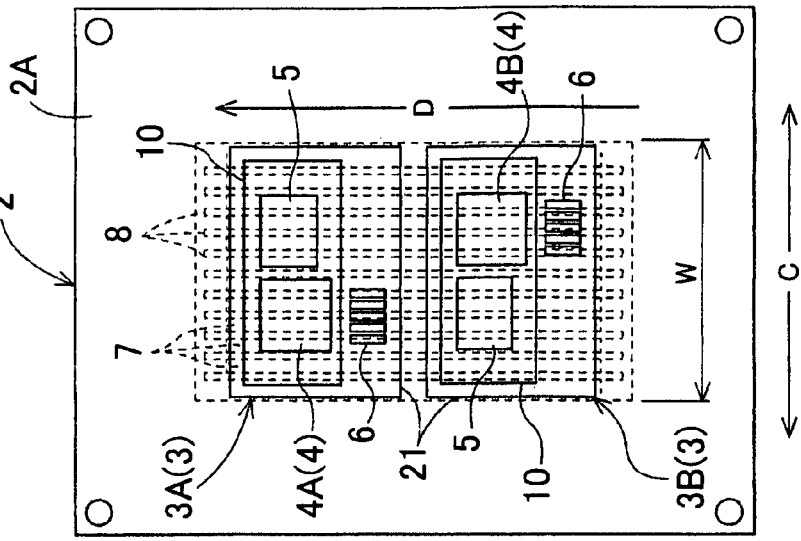
FIG. 11 is a plan view showing the configuration of a main section of a semiconductor module according to a fourth embodiment of the present invention.

A fourth embodiment of the present invention will be described according to the drawing. FIG. 11 is a plan view showing the configuration of the main section of the semiconductor module 1 according to this embodiment. In the semiconductor module 1 according to this embodiment, the arrangement configuration of the substrate 3 differs from that of the first to third embodiments. In order to simplify the drawing and the like, an example of a configuration in which only one set of the pair of substrates 3A and 3B is placed on one base plate 2, as in the second embodiment, will be described. However, a configuration in which a plurality of the sets of the pair of the substrates 3A and 3B are placed on the base plate 2, as in the first embodiment, may obviously be applied in a similar manner. Note that the configuration is similar to that of the first embodiment or the second embodiment, unless otherwise mentioned in this embodiment.

In the semiconductor module 1 according to this embodiment, the arrangement of the switching element 4, the diode element 5, and the connection terminal area 6 in the lower arm substrate 3A is the same as that of the first and second embodiments, but the arrangement of the switching element 4, the diode element 5, and the connection terminal area 6 in the upper arm substrate 3B is different. That is, in the upper arm substrate 3B, the switching element 4 is arranged on the lower arm substrate 3A side with respect to the connection terminal area 6 in this embodiment. Therefore, in the semiconductor module 1, only the connection terminal area 6 of the lower arm substrate 3A, which is one of the pair of substrates 3A and 3B, is arranged on the upper arm substrate 3B side with respect to the switching element 4A of the substrate 3A. Note that, since the diode element 5 of the upper arm substrate 3B is arranged in line with the switching element 4 in the perpendicular direction C, the diode element 5 is arranged on the lower arm substrate 3A side with respect to the connection terminal area 6 in a manner similar to the switching element 4. The positional relation between the switching element 4 and the diode element 5 in the perpendicular direction C in each of the substrates 3A and 3B is similar to that of the first and second embodiments.

Therefore, in the semiconductor module 1, the lower arm substrate 3A and the upper arm substrate 3B do not have the same configuration. The upper arm substrate 3B has a configuration in which the positional relation of the lower arm substrate 3A is reversed in the perpendicular direction C as in a mirror. The arrangement configuration of the substrate 3 of the semiconductor module 1 according to this embodiment is achieved by arranging the lower arm substrate 3A and the upper arm substrate 3B in line such that the switching elements 4 are both positioned on the downstream side of the coolant flow direction D.

5. Fifth Embodiment

Figure 12:
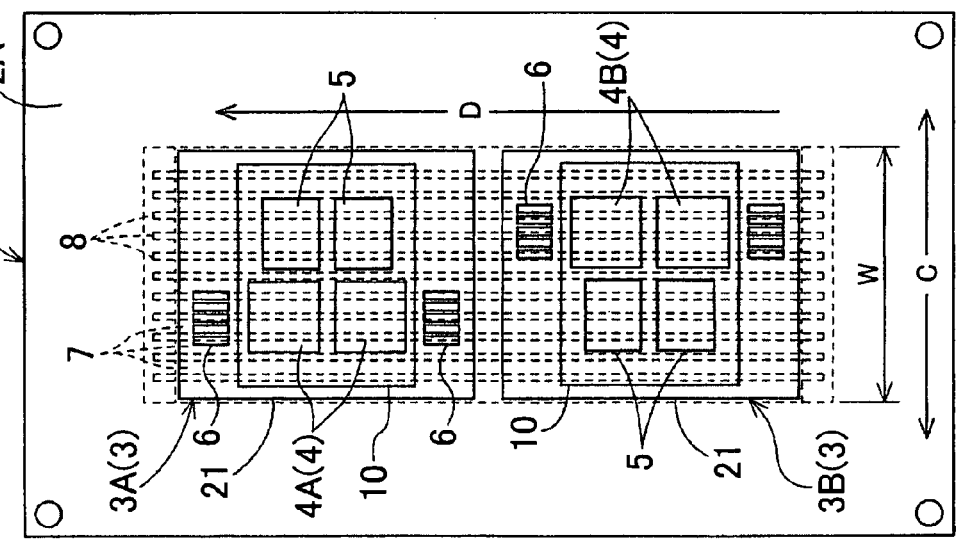
FIG. 12 is a plan view showing the configuration of a main section of a semiconductor module according to a fifth embodiment of the present invention.

A fifth embodiment of the present invention will be described according to the drawing. FIG. 12 is a plan view showing the configuration of the main section of the semiconductor module 1 according to this embodiment. The semiconductor module 1 according to this embodiment differs from that of the first to fourth embodiments mainly in that each substrate 3 includes two each of the switching element 4, the diode element 5, and the connection terminal area 6. In order to simplify the drawing and the like, an example of a configuration in which only one set of the pair of substrates 3A and 3B is placed on one base plate 2, as in the second embodiment, will be described. However, a configuration in which a plurality of the sets of the pair of the substrates 3A and 3B are placed on the base plate 2, as in the first embodiment, may obviously be applied in a similar manner. Note that the configuration is similar to that of the first embodiment or the second embodiment, unless otherwise mentioned in this embodiment.

In the semiconductor module 1 according to this embodiment, the arrangement of the switching element 4, the diode element 5, and the connection terminal area 6 on each substrate 3 is as follows. That is, the two switching elements 4 are adjacently arranged in line with each other in the coolant flow direction D. Also, the two diode elements 5 are adjacently arranged in line with each other in the coolant flow direction D. The two switching elements 4 and the two diode elements 5 are arranged in line in the perpendicular direction C. The two switching elements 4 and the two diode elements 5 are arranged on the same copper foil 10. In the example shown in the drawing, the switching element 4 has an external shape slightly larger than that of the diode element 5. The central position of the diode element 5 in the coolant flow direction D is arranged in a position deflected to one side in which the two diode elements 5 face each other with respect to the central position of the switching element 4 in the coolant flow direction D, whereby the edges on the facing side of the two switching elements 4 and the two diode elements 5 are in single straight lines. The connection terminal areas 6 are arranged in a position approximately the same as that of the two switching elements 4 in the perpendicular direction C, and are respectively arranged adjacent to both sides (upstream side and downstream side) of the coolant flow direction D with the two switching elements 4 there between.

In the relation between the pair of the lower arm substrate 3A and the upper arm substrate 3B arranged in line in the coolant flow direction D (in line in the vertical direction in FIG. 12), the two switching elements 4 are arranged on one side in the perpendicular direction C in one substrate 3, and the two diode elements 5 are arranged on the one side in the perpendicular direction C in the other substrate 3. Specifically, in the lower arm substrate 3A, the two switching elements 4 are arranged on the left side in the perpendicular direction C (left side in FIG. 12), and the two diode elements 5 are arranged on the right side in the perpendicular direction C (right side in FIG. 12). On the other hand, in the upper arm substrate 3B, in a manner opposite to that of the lower arm substrate 3A, the two diode elements 5 are arranged on the left side in the perpendicular direction C, and the two switching elements 4 are arranged on the right side in the perpendicular direction C. Note that the connection terminal area 6 is arranged, in a manner similar to the switching element 4, on the left side in the perpendicular direction C (left side in FIG. 12) in the lower arm substrate 3A, and is arranged on the right side in the perpendicular direction C in the upper arm substrate 3B. In this embodiment, in order to achieve an arrangement of the pair of the lower arm substrate 3A and the upper arm substrate 3B that satisfies such a relation, the pair of substrates 3A and 3B has the same configuration, and the pair of substrates 3A and 3B are arranged to be point symmetrical. In this case, the pair of substrates 3A and 3B are arranged to be point symmetrical with respect to the central position in both the coolant flow direction D and the perpendicular direction C of the pair of substrates 3A and 3B as the reference.

Figure 13:
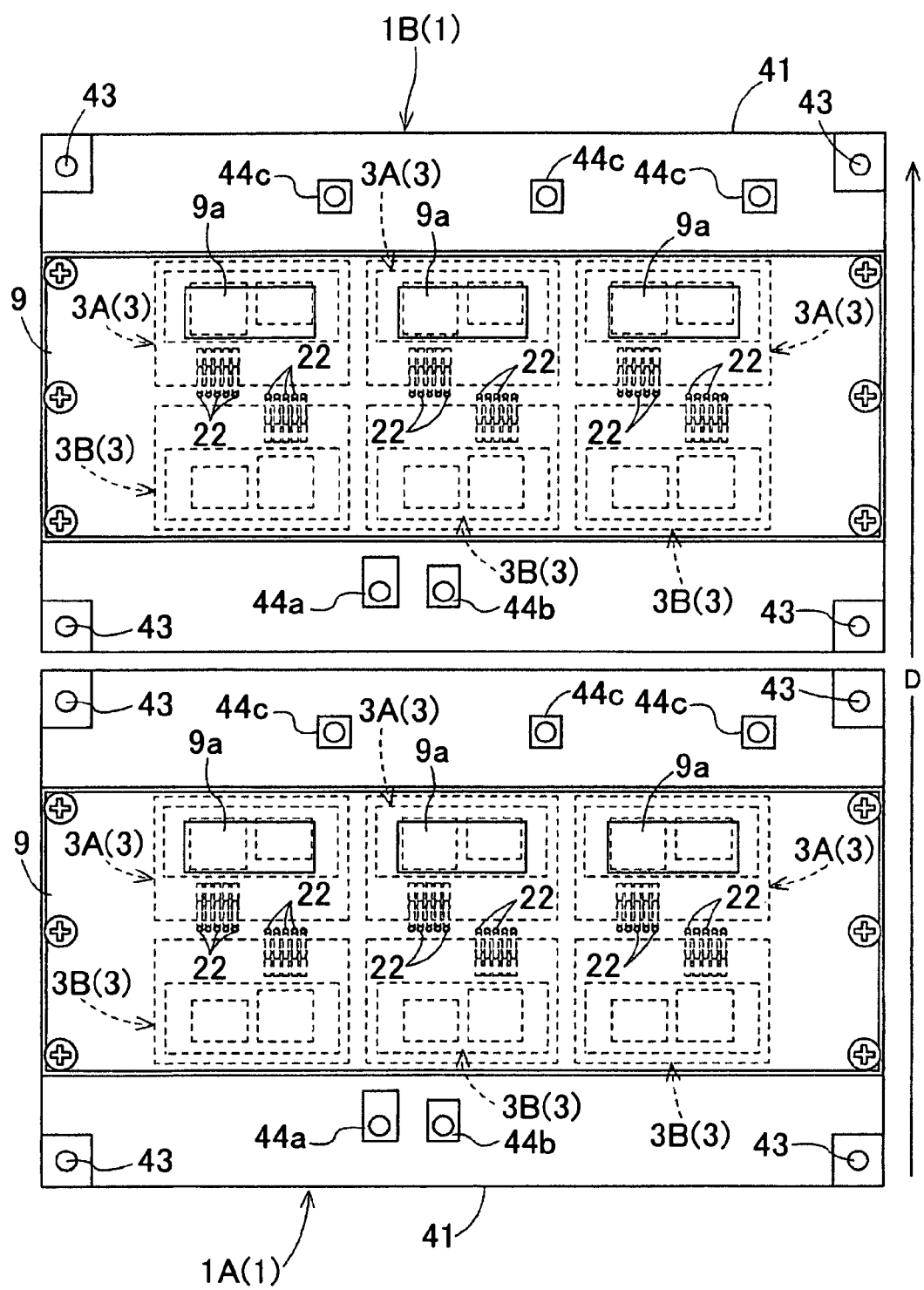
FIG. 13 is a diagram showing an example according to another embodiment of the present invention, in which two semiconductor modules having different heating values are arranged in line in a coolant flow path direction.

6. Other Embodiments (1) When a plurality of semiconductor modules 1 described above in each embodiment are used in combination and each semiconductor module 1 has a different heating value, it is preferable to arrange the semiconductor modules 1 in order so that the semiconductor module 1 having a higher heating value is on the upstream side of the coolant flow direction D. FIG. 13 shows an example in which two semiconductor modules 1A and 1B having different heating values are arranged in line in the coolant flow direction D. In this example, the configuration of each semiconductor module 1 is the same as that according to the first embodiment. The first semiconductor module 1A arranged on the upstream side of the coolant flow direction D has a higher heating value than the second semiconductor module 1B arranged on the downstream side of the coolant flow direction D. In this example, the coolant passes through the coolant flow path 7 of the first semiconductor module 1A and then passes through the coolant flow path 7 of the second semiconductor module 1B according to the flow direction D. This configuration allows the decrease in cooling performance, due to the coolant gradually rising in temperature as the coolant flows downstream in the flow direction D, and the heating value of each semiconductor module 1 to be balanced. Note that, when the plurality of semiconductor modules 1 have different heating values in this manner, the inverter circuit 11 formed of each semiconductor module 1 is formed to drive each electric motor having different outputs, for example, whereby the amount of current flowing through the switching element 4 of each semiconductor module 1 may differ.

Figure 14:
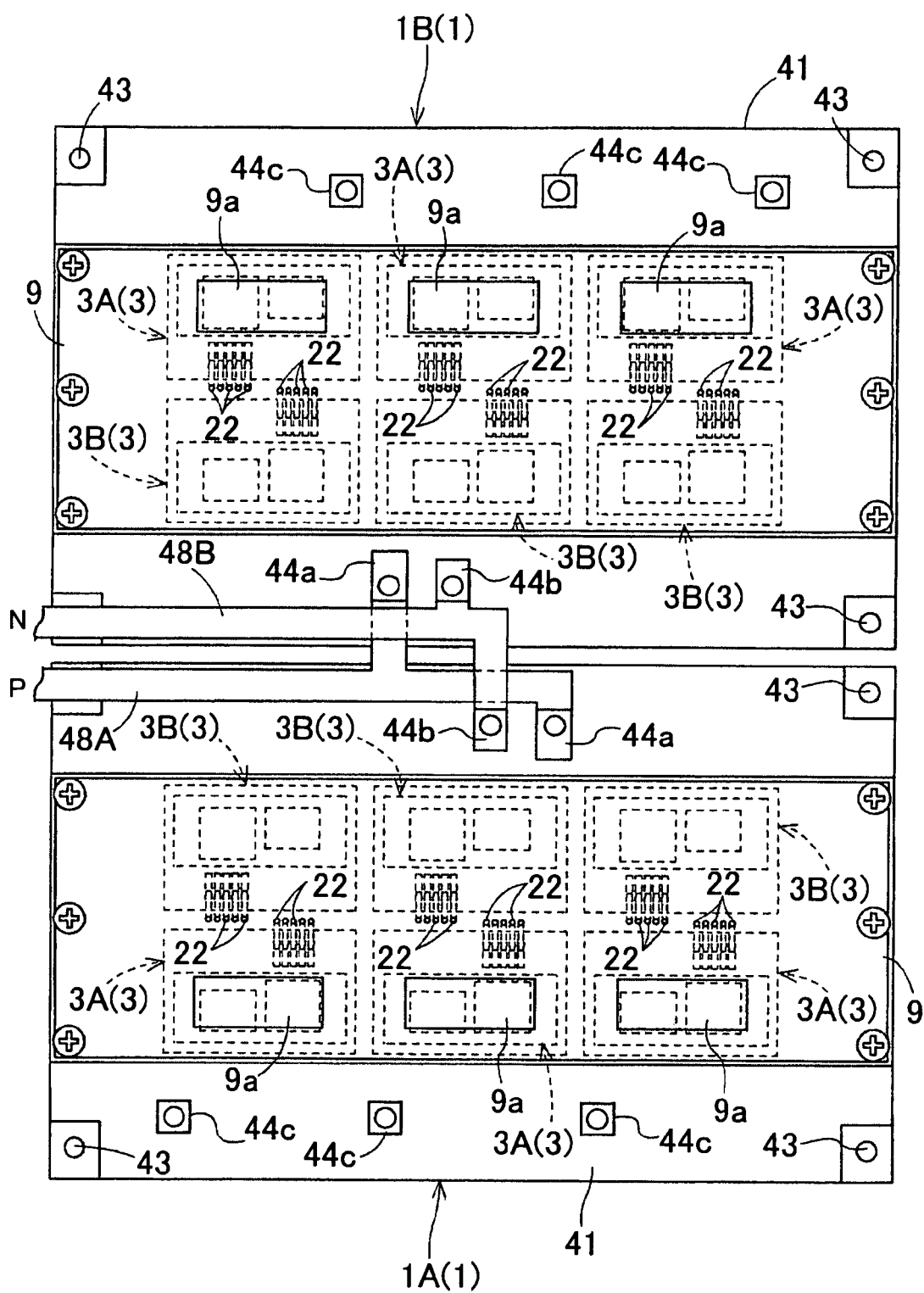
FIG. 14 is a diagram showing an example of the arrangement of two semiconductor modules according to another embodiment of the present invention.

(2) When a plurality of the semiconductor modules 1 in each embodiment described above are used in combination, it is preferable to arrange two semiconductor modules 1 such that the positive terminal 44a and the negative terminal 44b of each semiconductor module 1 are positioned on a side close to the other adjacent semiconductor module 1. FIG. 14 shows an example of such an arrangement of the two semiconductor modules 1A and 1B. In this example, the configuration of each semiconductor module 1 is the same as that of the first embodiment. The first semiconductor module 1A arranged on the lower side in FIG. 14 is arranged in a direction in which the positions of the positive terminal 44a and the negative terminal 44b are on the side of the adjacent second semiconductor module 1B. The second semiconductor module 1B arranged on the upper side in FIG. 14 is arranged in a direction in which the positions of the positive terminal 44a and the negative terminal 44b are on the side of the adjacent first semiconductor module 1A. By arranging the two semiconductor modules 1A and 1B in this manner, a positive bus bar 48A and a negative bus bar 48B of the two semiconductor modules 1A and 1B can be used commonly, and further, the positive bus bar 48A and the negative bus bar 48B can be arranged in parallel, as shown in FIG. 14. By arranging the positive bus bar 48A and the negative bus bar 48B in parallel in this manner, the occurrence of a magnetic field around the positive bus bar 48A and the negative bus bar 48B can be cancelled out by the influence of parallel currents each flowing in opposite directions in the positive bus bar 48A and the negative bus bar 48B, whereby the inductance of the positive bus bar 48A and the negative bus bar 48B can be reduced.

(3) In each embodiment described above, a case where a cooling liquid, in which ethylene glycol and the like are added to water, is used as the coolant have been described as an example, but the coolant of the present invention is not limited thereto. That is, various cooling media of a known liquid or gas may suitably be used for the semiconductor module 1 according to the present invention.

(4) In each embodiment described above, as a specific example of the configuration in which the elements or substrates are "arranged in line in the coolant flow direction D," the configuration in which the direction connecting the central positions of a plurality of elements or substrates is approximately parallel with respect to the coolant flow direction D has been described. However, the scope of the configuration in which the elements or substrates are "arranged in line in the coolant flow direction D" is not limited thereto. That is, even if the direction connecting the central positions of the plurality of elements or substrates is arranged in a direction which intersect the coolant flow direction D, it may be considered a configuration in which the elements or substrates are "arranged in line in the coolant flow direction D" as one preferred embodiment of the present invention in the case where at least a part of the elements or substrates are in a positional relation overlapping with each other in the perpendicular direction C.

(5) Similarly, in each embodiment described above, the configuration in which the direction connecting the central positions of a plurality of elements or substrates is arranged approximately parallel with respect to the perpendicular direction C has been described as a specific example of the configuration in which the elements or substrates are "arranged in line in the perpendicular direction C with respect to the coolant flow direction D." However, the scope of the configuration in which the elements or substrates are "arranged in line in the perpendicular direction C" is not limited thereto. That is, even if the direction connecting the central positions of the plurality of elements or substrates is arranged in a direction which intersect the perpendicular direction C, it may be considered a configuration in which the elements or substrates are "arranged in line in the perpendicular direction C" as one preferred embodiment of the present invention in the case where at least a part of the elements or substrates are in a positional relation overlapping with each other in coolant flow direction D.

(6) In each embodiment described above, an example in which the plurality of parallel fins 8 is provided to the lower surface 2B of the base plate 2 as a parallel flow formation unit has been described. However, the specific configuration of the parallel flow formation unit is not limited thereto. Thus, for example, a configuration in which the plurality of parallel fins 8 are formed on the side of the water path formation member 12 having a body separate from the base plate 2 and in which the upper surface of each fin 8 contacts the base plate 2 is also one preferred embodiment of the present invention. Any number, interval, and the like of the fins 8 may also be used. The parallel flow formation unit may also be formed by a component other than the fin 8. For example, parallel flows of the coolant in a specific direction can be formed in a similar manner by a plurality of long penetration holes, grooves, or the like provided to the base plate 2. In that case, the penetration hole, groove, or the like is the parallel flow formation unit.

(7) A configuration in which the tip of the fin 8 has a specific gap with respect to the facing plate member is also suitable. That is, although the case where the bottom surface (lower surface in FIG. 2 and FIG. 3) of the fin 8 as the parallel flow formation unit is provided to contact the contact plate section 12b of the water path formation member 12 has been described as an example in each embodiment described above, a configuration in which the bottom surface of the fin 8 has a specific gap with respect to the contact plate section 12b is also suitable. Similarly, when the fin 8 is formed on the water path formation member 12 side, a configuration in which the upper surface of the fin 8 has a specific gap with respect to the lower surface 2B of the base plate 2 is also suitable.

(8) In each embodiment described above, an example in which each of the parallel flows of the coolant formed by the parallel flow formation unit is linear has been described. However, the parallel flows of the coolant formed by the parallel flow formation unit is not limited to a linear flow, and may be a curved flow having a bend section such as a wave form as one preferred embodiment of the present invention. In this case, if the parallel flow formation unit is the fin 8, for example, each fin 8 is curved in a bended wave form or the like in planar view.

(9) In each embodiment described above, an example in which the lower arm substrate 3A including the lower arm switching element 4A is arranged on the downstream side in the coolant flow direction D with respect to the upper arm substrate 3B has been described. However, a configuration in which the lower arm substrate 3A is arranged on the upstream side in the coolant flow direction D with respect to the upper arm substrate 3B is also one preferred embodiment of the present invention. In this case, in terms of reliability of the temperature management, it is preferable to omit the temperature detection circuit 9a for the lower arm switching element 4A and provide the temperature detection circuit 9a of the upper arm switching element 4B arranged on the downstream side of the coolant flow direction D. Note that this does not preclude a configuration in which the temperature detection circuit 9a of the upper arm switching element 4B arranged on the downstream side of the coolant flow direction D is omitted and the temperature detection circuit 9a of the lower arm switching element 4A arranged on the upstream side of the coolant flow direction D is provided. The temperature detection circuit 9a may also be provided to both of the lower arm switching element 4A and the upper arm switching element 4B.

(10) In each embodiment described above, a configuration in which the plurality of substrates 3 are arranged on the upper surface 2A of the base plate 2 and the coolant flow path 7 is provided to the lower surface 2B of the base plate 2 has been described as an example, but the embodiment of the present invention is not limited thereto. That is, the arrangement direction of the base plate 2 is arbitrary, and setting the surface in which the plurality of substrates 3 are arranged to face downward or sideways is also one preferred embodiment of the present invention.

(11) In the first, second, and fifth embodiments described above, an example in which the pair of substrates 3A and 3B have the exact same configuration have been described. However, in order to achieve the arrangement of the pair of substrates 3A and 3B described above, it is not necessary that the configurations of the pair of substrates 3A and 3B be completely the same, as long as at least the arrangements of the switching element 4, the diode element 5, and the connection terminal area 6 of each substrate 3 are the same. Therefore, a configuration in which the lower arm substrate 3A and the upper arm substrate 3B have the same arrangements regarding the switching element 4, the diode element 5, and the connection terminal area 6 but have different configurations otherwise, and in which the pair of substrates 3A and 3B are arranged to be point symmetrical is also one preferred embodiment of the present invention.

(12) In each embodiment described above, an example in which the semiconductor module 1 is applied to the inverter circuit 11 or the chopper circuit has mainly been described. However, the scope of application of the present invention is not limited thereto, and may be suitably utilized for various semiconductor modules 1 that require appropriate cooling of the switching element 4.

The present invention can be suitably utilized for a semiconductor module including a base plate, a plurality of substrates placed on one surface of the base plate and each including a switching element, a diode element, and a connection terminal area, and a coolant flow path provided to contact the other surface of the base plate.

According to an exemplary aspect of the invention, the switching elements of each of the pair of substrates arranged in series in the coolant flow direction are arranged in positions apparently different from each other in the perpendicular direction with respect to the coolant flow direction, in a configuration in which the switching element and the diode element of each of the plurality of substrates placed on the first surface of the base plate are arranged in series and in line in the perpendicular direction with respect to the coolant flow direction in the coolant flow path provided to the second surface of the base plate. Thus, a single flow of the coolant along the parallel flows in the coolant flow path can basically cool only the switching element of one of the pair of substrates. Therefore, each switching element of both of the pair of substrates can appropriately be cooled. In other words, the decrease in cooling performance for the switching element on the downstream side, due to a configuration in which a single flow of the coolant having a higher temperature after cooling the switching element of one substrate on the upstream side in the coolant flow direction further cools the switching element of the other substrate on the downstream side, can be suppressed. Thus, the switching element of all substrates placed on the first surface of the base plate can appropriately be cooled.

With this configuration, the connection terminal area of at least one substrate of the pair of substrates each including one of the pair of the lower arm switching element and the upper arm switching element is arranged on a side of the other substrate with respect to the switching element of the substrate, whereby the switching elements of both of the pair of substrates are arranged in the coolant flow direction with the connection terminal area of at least one substrate there between. Therefore, the switching elements, which generate most of the heat, of each substrate are arranged in positions relatively apart from each other. Thus, a thermal interference on the base plate caused by heat of the switching element included in each of the pair of substrates can be suppressed to appropriately cool the switching element of all substrates.

According to an exemplary aspect of the invention, as described above, the switching elements of each of the pair of substrates arranged in series in the coolant flow direction are arranged in positions apparently different from each other in the perpendicular direction with respect to the coolant flow direction, and the pair of substrates can be used commonly. Therefore, since the switching elements of each of the pair of substrates arranged in series in the coolant flow direction are arranged in positions apparently different from each other in the perpendicular direction with respect to the coolant flow direction, a plurality of types of substrates having different arrangements of the elements and the like are not necessary, whereby an increase in the manufacturing cost of the semiconductor module can be suppressed.

According to an exemplary aspect of the invention, the two switching elements of each of the pair of substrates are arranged in the coolant flow direction with the connection terminal areas of both substrates there between. Accordingly, the switching elements which generate most of the heat are arranged in positions apart from each other in the pair of substrates, whereby the occurrence of a thermal interference on the base plate caused by heat transmitted from each switching element of the pair of substrates can be suppressed. Thus, the switching element of all substrates can appropriately be cooled.

According to an exemplary aspect of the invention, the parallel flows of the coolant in a direction along the plurality of fins can appropriately be formed in the coolant flow path. Since providing the plurality of fins can increase the surface area of the coolant flow path, the heat transmitted from the substrate to the base plate can efficiently be discharged.

According to an exemplary aspect of the invention, the temperature detection unit for the switching element of the substrate arranged on the upstream side of the coolant flow direction can be omitted. Therefore, the configuration of the temperature detection unit can be simplified, and the manufacturing cost of the semiconductor module can be reduced. Normally, the temperature of the coolant is higher on the downstream side than on the upstream side of the coolant flow direction, whereby the switching element of the substrate arranged on the downstream side is likely to have a higher temperature than that of the switching element of the substrate arranged on the upstream side. Therefore, the temperature of the switching element of the substrate arranged on the upstream side does not exceed the specific operation security temperature range and thereby does not cause a problem, even if the temperature management is performed using only the temperature detection result of the switching element of the substrate arranged on the downstream side.

According to an exemplary aspect of the invention, the temperature detection unit can have a configuration in which the electric potential of the ground is the reference. Therefore, the configuration can be simplified compared to the temperature detection unit in which the source electric potential is the reference, and the manufacturing cost of the semiconductor module can be reduced.

According to an exemplary aspect of the invention, all switching elements forming the three-phase AC inverter circuit are provided to the base plate integrally, whereby the three-phase AC inverter circuit having a small size and light weight can easily be formed using the semiconductor module.

What is claimed is:

1. A semiconductor module comprising:
    a base plate;
    a plurality of substrates placed on one surface of the base plate, with each substrate of the plurality of substrates including a switching element, a diode element, and a connection terminal area; and
    a parallel flow forming device that forms parallel coolant flow paths that are provided so as to be in contact with the other surface of the base plate, wherein:
        the coolant flow paths are formed such that coolant flows in a coolant flow direction,
        the switching element and the diode element are arranged in line in a perpendicular direction with respect to the coolant flow direction,
        the switching element and the connection terminal area are arranged in positions differing in the coolant flow direction in each of the substrates,
        a pair of substrates of the plurality of substrates is arranged in series in the coolant flow direction,
        the switching element of one of the substrates of the pair of substrates is arranged on one side in the perpendicular direction, and the diode element of the other substrate of the pair of substrates is arranged on the one side in the perpendicular direction,
        the connection terminal area of at least one substrate of the pair of substrates is arranged closer to a side that is between the pair of substrates with respect to the switching element of the at least one substrate of the pair of substrates, and
        the switching elements of the pair of substrates are arranged at different positions in the perpendicular direction.

2. The semiconductor module according to claim 1, wherein the pair of substrates have an identical structure with each other and are arranged to be symmetrical.

3. The semiconductor module according to claim 1, wherein both of the connection terminal areas of the pair of substrates are arranged closer to the side that is between the pair of substrates with respect to the switching elements of each substrate.

4. The semiconductor module according to claim 1, wherein the parallel flow forming device is a plurality of fins arranged parallel with each other along the other surface of the base plate.

5. The semiconductor module according to claim 1, further comprising:
    a temperature detecting device that detects a temperature of the switching elements of both substrates of the pair of substrates, wherein the temperature detecting device is provided for the switching element of the substrate of the pair of substrates arranged on a downstream side of the coolant flow direction.

6. The semiconductor module according to claim 1, wherein the switching element of the one of the substrates of the pair of substrates is arranged on the one side in the perpendicular direction, and the switching element of the other substrate of the pair of substrates is arranged on the other side in the perpendicular direction.

7. The semiconductor module according to claim 1, wherein the pair of substrates is provided with one of a pair of a lower arm switching element and an upper arm switching element.

8. The semiconductor module according to claim 7, further comprising:
    a temperature detecting device that is mounted on the lower arm switching element, wherein temperature detection is carried out for temperature control of the switching elements of both substrates of the pair of substrates.

9. The semiconductor module according to claim 1, wherein the plurality of substrates includes six substrates, each substrate including one of the lower arm switching element and the upper arm switching element of each phase forming a three-phase AC inverter circuit is placed on the one surface of the base plate.

10. An inverter device including the semiconductor module according to claim 1.

11. A semiconductor module comprising:
    a base plate;
    a plurality of substrates placed on one surface of the base plate, with each substrate of the plurality of substrates including a switching element, a diode element, and a connection terminal area; and
    a parallel flow forming device that forms parallel coolant flow paths that are provided so as to be in contact with the other surface of the base plate, wherein:
        the coolant flow paths are formed such that coolant flows in a coolant flow direction,
        the switching element and the diode element are arranged in line in a perpendicular direction with respect to the coolant flow direction,
        the switching element and the connection terminal area are arranged in positions differing in the coolant flow direction in each of the substrates,
        a pair of substrates of the plurality of substrates is arranged in series in the coolant flow direction,
        the connection terminal area is arranged on a first side in the perpendicular direction for one substrate of the pair of substrates and on a second side in the perpendicular direction for the other substrate of the pair of substrates,
        the diode element is arranged on the second side in the perpendicular direction for the one substrate of the pair of substrates and on the first side in the perpendicular direction for the other substrate of the pair of substrates,
        the connection terminal area of at least one substrate of the pair of substrates is arranged closer to a side that is between the pair of substrates with respect to the switching element of the at least one substrate of the pair of substrates, and
        the switching elements of the pair of substrates are arranged at different positions in the perpendicular direction.

12. The semiconductor module according to claim 11, wherein the pair of substrates have an identical structure with each other and are arranged to be symmetrical.

13. The semiconductor module according to claim 11, wherein both of the connection terminal areas of the pair of substrates are arranged closer to the side that is between the pair of substrates with respect to the switching elements of each substrate.

14. The semiconductor module according to claim 11, wherein the parallel flow forming device is a plurality of fins arranged parallel with each other along the other surface of the base plate.

15. The semiconductor module according to claim 11, further comprising:
a temperature detecting device that detects a temperature of the switching elements of both substrates of the pair of substrates, wherein the temperature detecting device is provided for the switching element of the substrate of the pair of substrates arranged on a downstream side of the coolant flow direction.

16. The semiconductor module according to claim 11, wherein the switching element of the one of the substrates of the pair of substrates is arranged on the one side in the perpendicular direction, and the switching element of the other substrate of the pair of substrates is arranged on the other side in the perpendicular direction.

17. The semiconductor module according to claim 11, wherein the pair of substrates is provided with one of a pair of a lower arm switching element and an upper arm switching element.

18. The semiconductor module according to claim 17, further comprising:
a temperature detecting device that is mounted on the lower arm switching element, wherein temperature detection is carried out for temperature control of the switching elements of both substrates of the pair of substrates.

19. The semiconductor module according to claim 11, wherein the plurality of substrates includes six substrates, each substrate including one of the lower arm switching element and the upper arm switching element of each phase forming a three-phase AC inverter circuit is placed on the one surface of the base plate.

20. An inverter device including the semiconductor module according to claim 11.

* * * * *